United States Patent [19]

Agiman

[11] Patent Number: 5,051,612
[45] Date of Patent: Sep. 24, 1991

[54] PREVENTION OF PARASITIC MECHANISMS IN JUNCTION ISOLATED DEVICES

[75] Inventor: Dan Agiman, Lewisville, Tex.

[73] Assignee: Texas Instruments Incorporated, Dallas, Tex.

[21] Appl. No.: 309,514

[22] Filed: Feb. 10, 1989

[51] Int. Cl.$^5$ .......................... H03K 3/01; H03K 3/26
[52] U.S. Cl. ................................. 307/296.2; 357/47; 307/303
[58] Field of Search ................. 307/296.2, 296.6, 303, 307/303.1; 357/47, 48

[56] References Cited

U.S. PATENT DOCUMENTS

| | | | |
|---|---|---|---|
| 3,649,887 | 3/1972 | Keller et al. | 357/48 |
| 3,931,634 | 1/1976 | Knight | 357/48 |
| 4,115,709 | 9/1978 | Inoue et al. | 307/304 |
| 4,578,695 | 3/1986 | Delaporte et al. | 307/351 |
| 4,633,095 | 12/1986 | Komatu | 307/255 |
| 4,704,705 | 11/1987 | Womack | 365/149 |
| 4,888,623 | 12/1989 | Enomoto et al. | 357/48 |

OTHER PUBLICATIONS

"Isolation Method and Structure for Integrated Devices", IBM Technical Disclosure Bulletin, by Pieczonka et al., vol. 8, No. 4, Sep. 1965.

Primary Examiner—Stanley D. Miller
Assistant Examiner—Richard Roseen
Attorney, Agent, or Firm—B. Peter Barndt; James T. Comfort; Melvin Sharp

[57] ABSTRACT

A method of preventing forward biasing of PN junctions in junction isolated semiconductor devices to prevent parasitic transistor action. A biasing element is connected to the substrate/isolation regions to switch the regions to a low potential. The method is particularly well suited for implementation in the new multi-epitaxial semiconductor processes and structures.

24 Claims, 4 Drawing Sheets

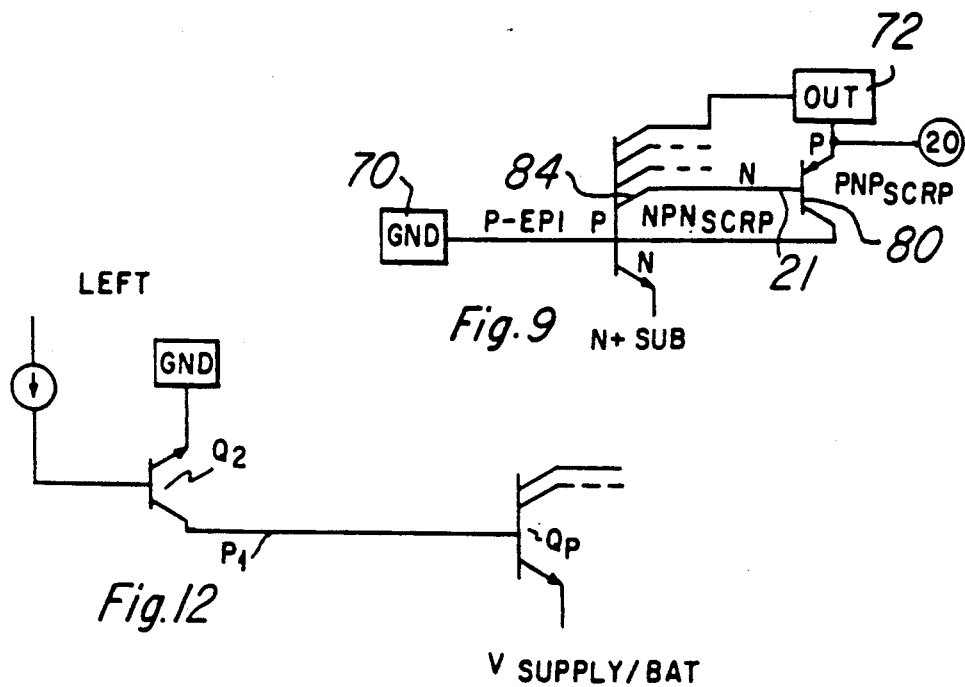
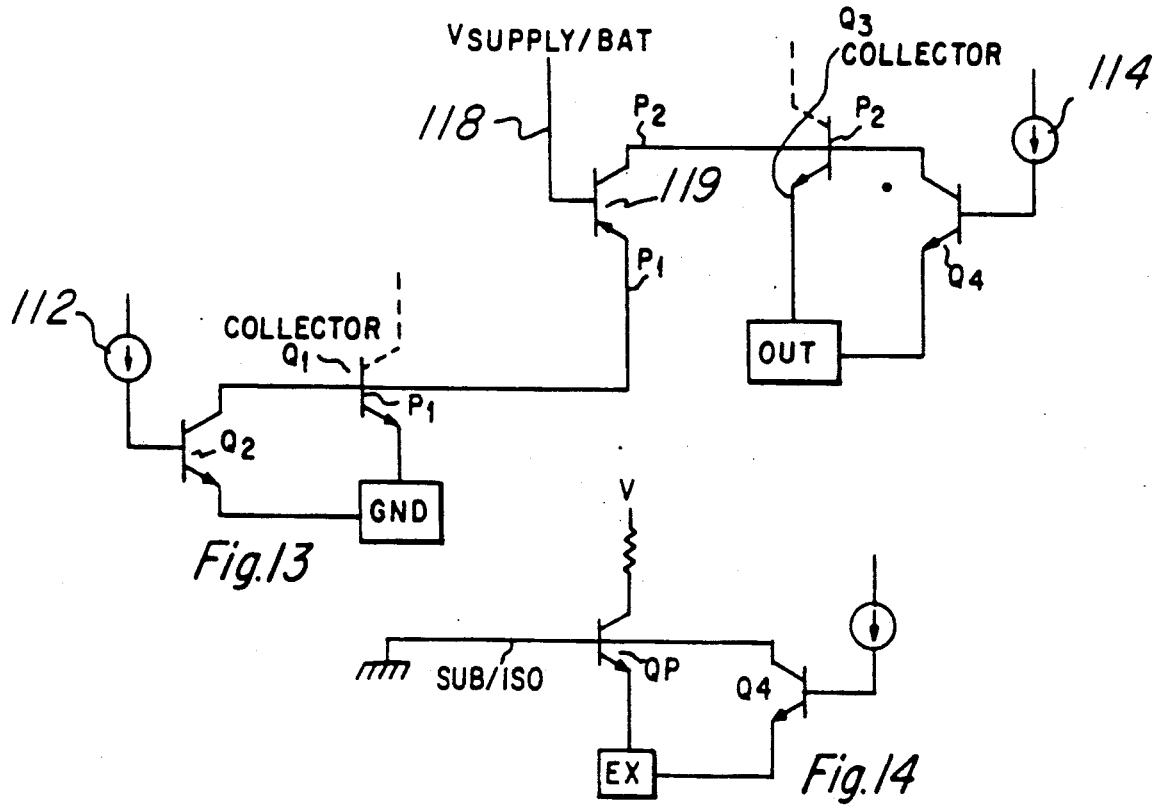

PREVENTION OF PARASITIC MECHANISMS IN JUNCTION ISOLATED DEVICES

BACKGROUND OF THE INVENTION

I. Field of the Invention

The present invention relates generally to junction isolated semiconductor devices and relates more particularly to methods for preventing parasitic mechanisms in such devices.

II. Description of the Related Art

One of the disadvantages of BiPOLAR and Field Effect Transistor (FET) junction isolated technologies is the feature that makes it useful, namely the junction isolation. The problem specifically relates to the difficulty in maintaining proper biasing of the substrate/isolation-active region junctions to ensure that the N side of a P-N junction remains at a higher potential (i.e., reverse biased) relative to the P side. Improper biasing may cause integrated circuit (IC) device malfunction and/or destruction during reverse voltage conditions.

The prior art mainly subscribes to fixed voltage biasing of the isolation regions. However, as in the case of a P-type isolated device, an output pin voltage more negative than the isolation voltage may cause device failure. Also, when the output also has to sustain a reverse battery supply condition, device failure is more probable than not. This condition can occur, for example, in automotive electronics when battery cables are reversed. The detrimental effect is that the junctions become forward biased and parasitic mechanisms such as transistor or diode action occurs. This leads to malfunction and destruction of the desired integrated circuit components. Thus a need exists for a means of preventing parasitic forward biasing of substrate/isolation-active region PN junctions.

The words substrate/isolation used together, in the context of this application simply indicate that the isolation regions are of the same conductivity as the underlying substrate, and are continuous. That is, there is no physical separation between them. The term "substrate/isolation-active" is a term which is used only with the word "region" following the word "active", and simply refers to the junction between the substrate/isolation and the active regions.

SUMMARY OF THE INVENTION

The problems and detrimental aspects of the prior art are solved by the present invention. In one embodiment of the present invention a substrate/isolation biasing element is designed into the device structure to prevent forward biasing of the substrate/isolation-active region junctions.

In an alternative embodiment of the present invention, substrate/isolation biasing in multi-epitaxial device structures is achieved. The present invention can be utilized when the isolation junction comprises an epitaxial-tank/substrate junction, or an epitaxial-tank/isolation region junction.

BRIEF DESCRIPTION OF THE DRAWING FIGURES

Further features, advantages and variations of the present invention will become more apparent from the following and more particular and detailed description of the invention, when read in view of the following drawing figures, wherein:

FIG. 9 is a schematic circuit diagrams of the FIG. 8 wafer illustrating parasitic device action under reverse supply conditions;

FIGS. 11 and 12 are schematic circuit diagrams of the present invention as shown in FIG. 10 wafer; and FIG. 13 is a schematic diagram of the present invention in an embodiment depicting simultaneous biasing of different isolation regions with different biasing voltages.

FIG. 14 is a schematic diagram of the present invention in an embodiment depicting biasing of an isolation region with a single transistor.

DETAILED DESCRIPTION OF THE PREFERRED EMBODIMENTS

Figure 1:
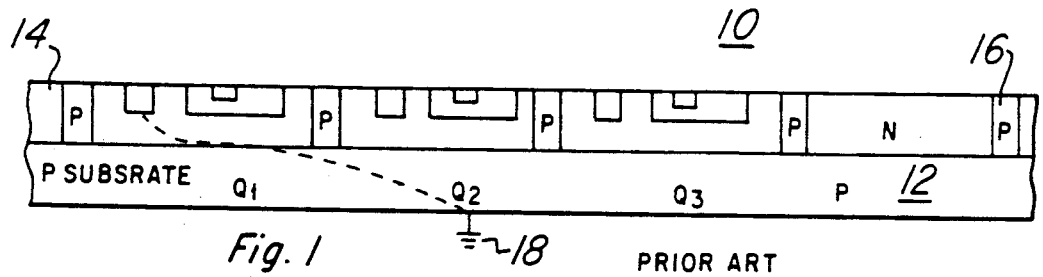
FIG. 1 is a schematic cross section diagram of a semiconductor wafer depicting a prior art fixed ground substrate/isolation biasing scheme.

Referring now to the drawing figures, wherein like reference characters designate like or corresponding parts throughout the several views, FIG. 1 depicts a conventional prior-art semiconductor wafer 10 having a P-type substrate 12, N-type epitaxial layer 14, P-type junction isolation regions 16, and active devices Q1, Q2, Q3 formed in epitaxial layer 14 and separated by the junction isolation regions 16. The active devices are formed in epitaxial regions referred to as tanks. The FIG. 1 device is shown having substrate 12 biased to ground by ground connection pin 18. This is an example of conventional fixed ground substrate biasing of a semiconductor wafer. Parasitic mechanisms such as a parasitic transistor having as its emitter the epitaxial region of Q1, its collector being the epitaxial tank region of Q2, and its base being the P-type substrate 12, is being turned off by grounding the substrate(base). This conventional substrate biasing has many shortcomings such as not providing protection for reverse voltage/battery conditions. It should be noted that wafer is often used in the semiconductor art to refer to either a semiconductor base material such as substrate 12 or as the layered device 10.

Figure 2:
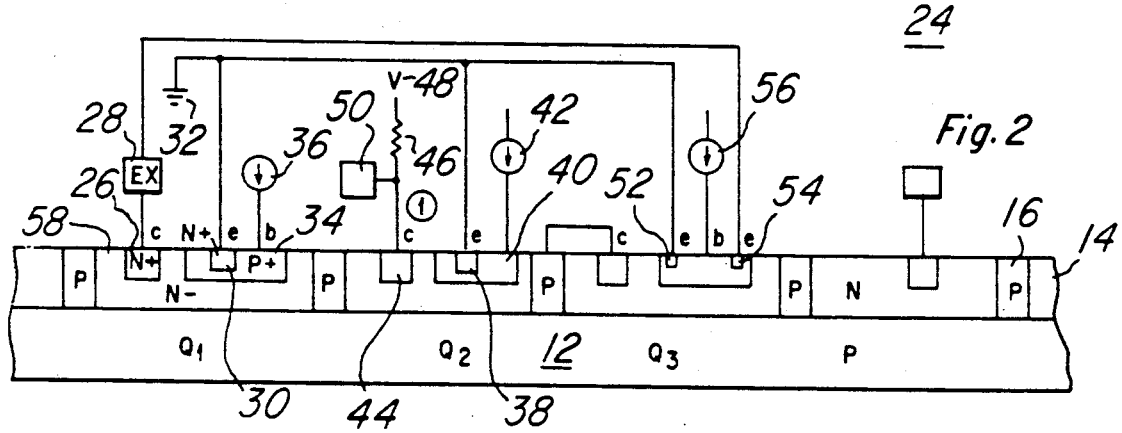
FIG. 2 is a schematic cross-section diagram of the FIG. 1 wafer depicting an embodiment of the present substrate/isolation biasing element.

Referring now to FIG. 2, there is depicted a junction isolated bipolar semiconductor IC- device 24. The illustration of bipolar transistors is for purposes of illustration only and not limitation. The teachings of the present invention can and are intended to be incorporated into Field Effect Devices (FET) such as MOSFETs as well as combinations of the two such as BiMOS or BiCMOS devices. The invention broadly pertains to junction isolated devices. Integrated circuit 24 is conventional with the biasing circuit of the present invention added and is functionally connected to operate in a desired manner. For example, collector 26 of transistor Q1 is connected to external pin 28, emitter 30 is connected to ground 32 and base 34 is driven by an internal circuit function, which for purposes of illustration is simplified as a current source 36. Similarly, transistor Q2 has its emitter 38 connected to ground potential 32, its base 40 is internally driven by current source 42 and its collector 44 is connected through pull-up resistor 46 to voltage potential 48. It should be noted that the internal functions, such as current sources 36 and 42, driving the bases of transistors Q1 and Q2 may be the same or different.

In operation of the FIG. 2 circuit, with substrate biased at ground potential as illustrated in FIG. 1, a negative voltage present on external pin 28 will result in forward biasing of the substrate/isolation-active region (or tank) junction. This may result in the formation of various parasitic diodes or lateral NPN transistors. As previously discussed with reference to FIG. 2, one such parasitic transistor could have Q1 collector as an emitter, the substrate or the isolation as a base, and Q2 collector as a collector. Unlimited current drive is made available to this parasitic transistor from ground pin to the substrate and isolation. Instead of desired IC operation, the parasitic transistor collector will saturate, pulling pin 50 to a low voltage when it may be normally assumed high. This action will render the desired IC device nonfunctional. The present invention prevents this and other types of parasitic actions from occurring.

Figure 3:
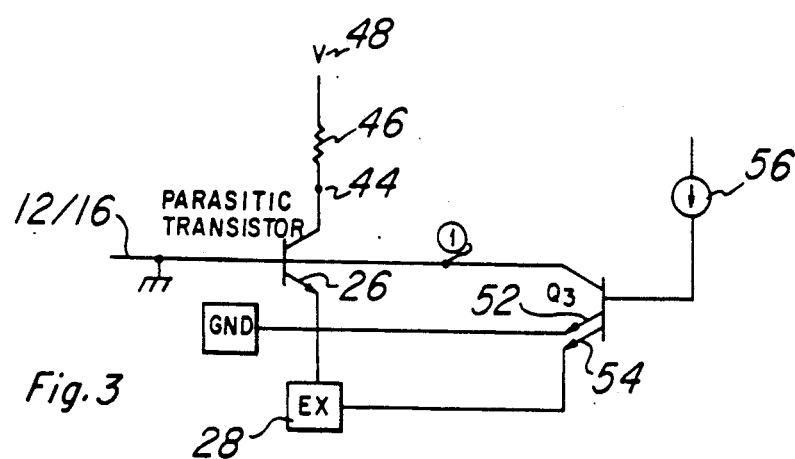
FIG. 3 is a schematic circuit diagram of the present invention as applied in FIG. 2.

In accordance with the teachings of the present invention, a substrate/isolation biasing element is incorporated into the IC circuit. This element biases the substrate/isolation to the lowest potential available so that the parasitic NPN action never occurs. This biasing element is represented in FIGS. 2 and 3 as transistor Q3 and the corresponding circuit connections. As shown transistor Q3 has dual emitters 52 and 54. Its collector is connected to junction isolation 16, and its base is internally driven by a similar current source function 56 as discussed with reference to transistors Q1 and Q2. Emitter 52 is connected to ground pin 32 and emitter 54 is connected to external pin 28. Under normal conditions, when the voltage present at external pin 28 is greater than ground voltage, the substrate 12 will be switched to ground. However, when the external pin voltage is lower than ground, substrate 12 will be biased to the external pin voltage potential. This clamping action/switching action reduces the voltage drop across the isolation/Q1 epitaxial tank 58 junction and prevents formation of parasitic lateral NPN transistors. Additionally, Q2 emitter base reverse voltage prevents ground currents from entering the substrate/isolation region. FIGS. 2 and 3 depict a simplified version of the present invention.

Figure 4:
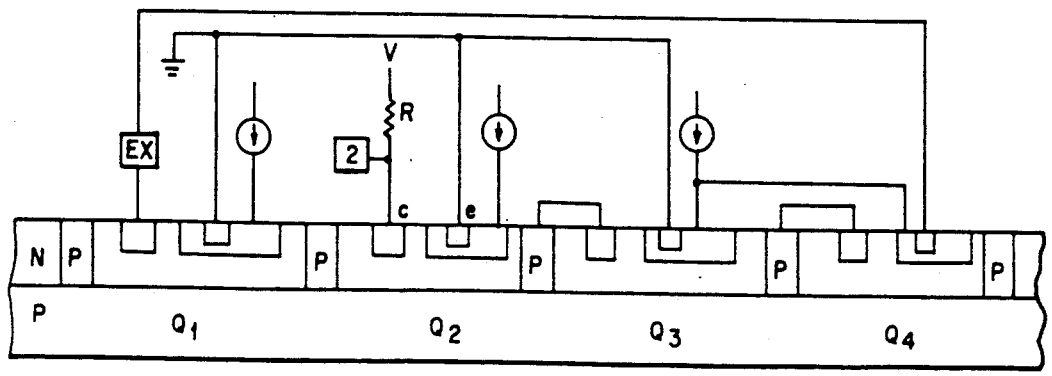
FIG. 4 is a schematic cross-section of a semiconductor wafer including a preferred embodiment of the present substrate/isolation biasing elements.
Figure 5:
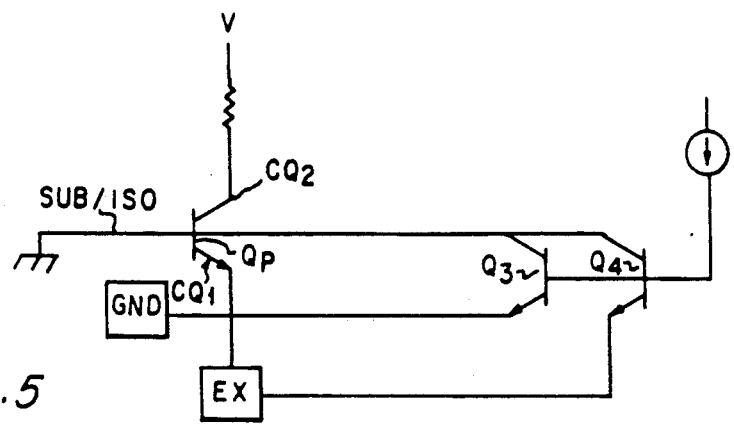
FIG. 5 is a schematic circuit diagram of the present invention as applied in FIG. 4.

Referring now to drawing FIGS. 4 and 5, there is illustrated a preferred embodiment of the present invention wherein the substrate/isolation biasing element comprises separate transistors Q3 and Q4, and the corresponding circuit connections, instead of the single dual emitter transistor of the FIG. 2.

Figure 6:
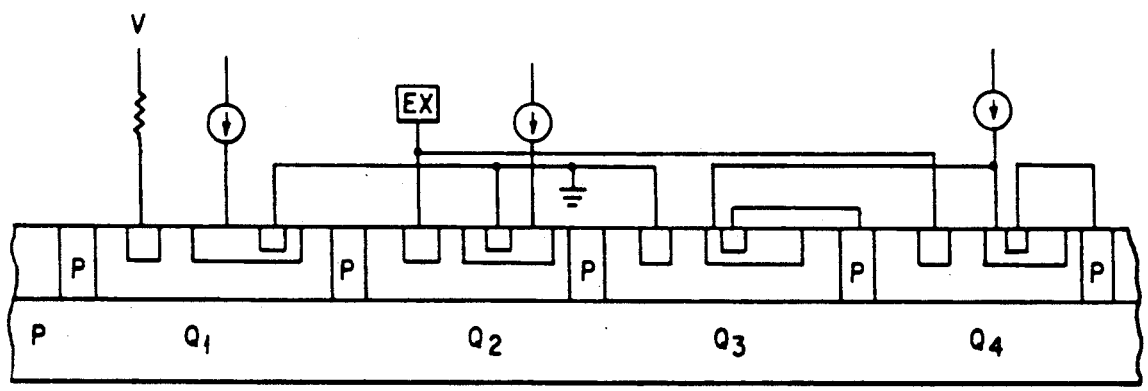
FIG. 6 is a schematic cross-section diagram of a semiconductor wafer depicting an inverse operating mode transistors incorporating the present biasing elements.
Figure 7:
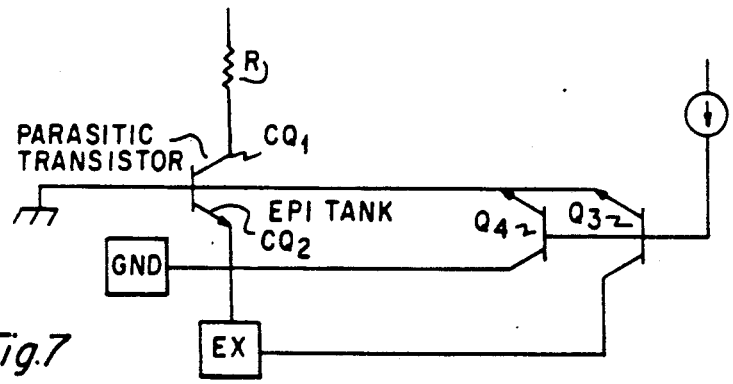
FIG. 7 is a schematic circuit diagram of the FIG. 6 embodiment.

FIGS. 6 and 7 depict wafer level and corresponding circuit schematic for an inverse transistor action embodiment of the invention, (i.e., when the collector is used as an emitter and the emitter is used as the collector). This circuit arrangement results in a further increase in the input to ground breakdown voltage handling capabilities of the circuit.

Figure 8:
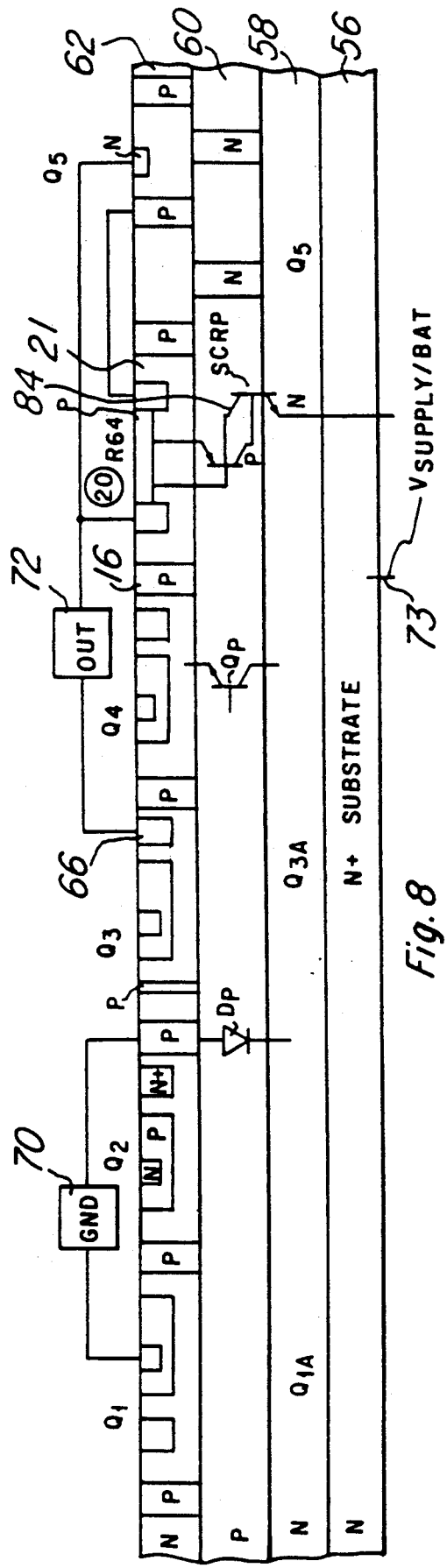
FIG. 8 is a schematic cross-section diagram of a multi-epitaxial semiconductor wafer depicting desired and parasitic devices.

Referring now to FIG. 8, proper biasing of substrate/isolation-active region junctions in multi-epitaxial processes is considered. This is one order of magnitude more complex than the conventional single-epitaxial processes. FIG. 8 depicts an integrated circuit device formed by a multi-epitaxial process. The process allows integration of high voltage, power and logic/analog devices on one chip. This process may comprise forming a first N-type epitaxial layer 58 on a N+ substrate 56, followed by formation of P-type epitaxial layer 60 and top N-type epitaxial layer 62. For purposes of illustration, transistor Q1 may represent a logic/linear device with ground referenced operating conditions. Transistor Q3 and resistor R-64 may represent logic/linear components with output referenced operating conditions. And transistor Q5 may represent a NPN vertical power structure. It should be noted at this point that the type of active or passive devices or components formed is of little consequence to the implementation of the present invention.

If, during operation of the IC of FIG. 8, the output will see negative voltage, it becomes apparent that a parasitic vertical NPN transistor Q3A will have collector 66 of transistor Q3 as its emitter, P isolation 16 and P-epitaxial layer 60 as its base, and epitaxial layer 58 and N+ substrate 56 as its collector. With unlimited current drive entering from ground pin 70, this parasitic transistor will conduct heavily, preventing an output negative swing from occurring. Output negative swing is essential for certain automotive applications such as a high side driver, where a large negative swing is needed, for fast inductive load turn off.

A reverse battery supply condition presents an additional set of problems. For example, consider the condition where the N+ substrate 56 has a negative voltage with respect to ground and output pins, 70 and 72 respectively. A parasitic diode 74 will conduct short circuit current and destruct. Additionally, parasitic transistor Q3A may be a multiple collector NPN transistor with epitaxial tank 84 of resistor 64 as one collector. This collector pulled low will trigger a silicon controlled rectifier (SCR) involving but not limited to the base diffusion resistor 64. The SCR structure is formed by PNPN diffusions and is represented by PNP/NPN transistors 80 and 82 as depicted in FIG. 9. Once forward biased and draws bias current, the SCR will turn on in a self driving mode. This conduction will lead to destruction of the IC. It should be noted that in this particular example involving resistor 64, node 84 is the collector of the NPN-SCR and also the base of the PNP-SCR.

Figure 10:
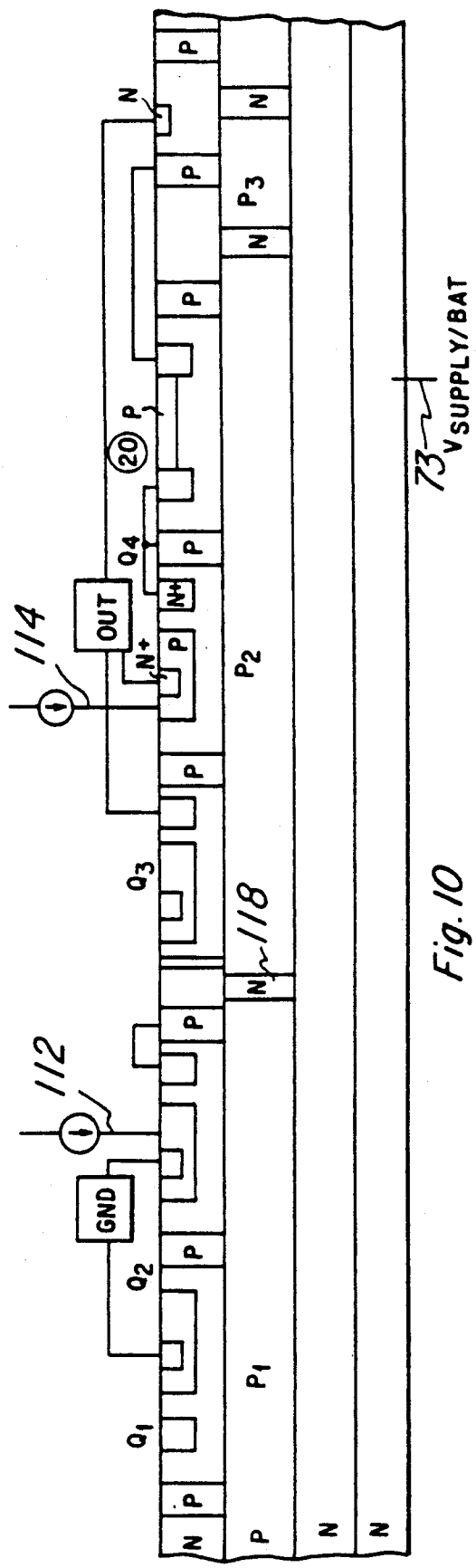
FIG. 10 is a schematic cross-section diagram of the FIG. 8 wafer incorporating an embodiment of the present biasing elements.

FIG. 10 illustrates implementation of the present invention for multi-epitaxial technology. The isolation/P region was sectioned by an N-type buried layer (NBL) to two main regions for purposes of simplifying discussion of the parasitic mechanisms and implementation of the present invention.

The isolation/P1 region is biased to ground pin by transistor Q2. Q2 may be internally driven by a current source 112, or by ICC for current budgeting consideration. Reverse supply blocking will be exercised by Q2 BVEBO. Similarly, the isolation/P2 region is biased to the output pin by transistor Q4. Again, Q4 may be internally driven by a current source 114 and carefully budgeted during "SLEEP MODE." Reverse supply blocking from the output pin will be exercised by Q4 BVEBO. Additionally, the SCR will not trigger since its current triggering path is interrupted by Q4 emitter, being reverse biased. Finally, the isolation/P2 region being switched to the output potential prevents forward biasing of the isolation/Q3 EPI tank junction and prevents formation of parasitic lateral/vertical NPN structures.

Figure 11:
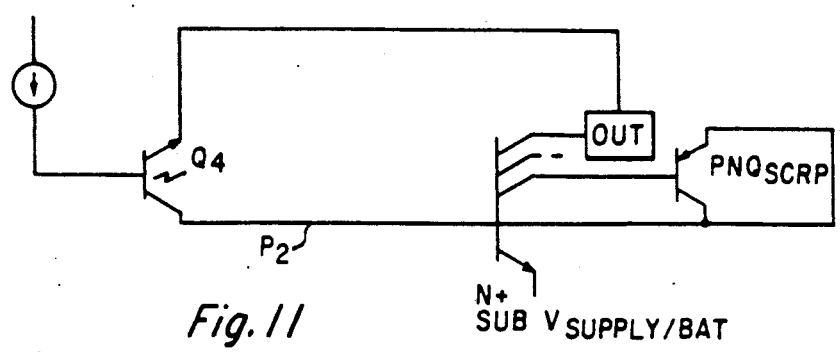

FIGS. 11 and 12 depict in schematic form how the present invention functions to prevent activation of parasitic mechanisms in the embodiment of FIG. 10, under negative and reverse supply conditions.

Referring now to FIGS. 10 and 13, there is depicted, in wafer and schematic form, a parasitic PNP transistor formed having N isolation region 118, the first N epitaxial layer and the N substrate as its base, region Pl as its emitter and region P2 as its collector. This transistor will be held "OFF" by bias from the voltage supply or battery 73. This arrangement will allow simultaneous application of different voltage biasing to different isolation regions. Normally the supply voltage will be the highest potential applied to the circuit. The PNP parasitic transistor 119 will turn on only when the base voltage is below the emitter voltage. Note that either Pl or P2 could be the emitter. Because the parasitic PNP 119 is held off, substrate/isolation bias elements, Q2 and Q4, can simultaneously apply different biasing voltages to their respective isolation regions.

As depicted in the drawing figures parasitic active and passive devices are indicated by a "p" designation. Additionally, although the external connection such as 72 (FIG. 9) are depicted as outputs they may also be inputs.

TECHNICAL ADVANTAGES OF THE INVENTION

From the foregoing, a novel method for preventing parasitic mechanisms in junction isolated devices is disclosed. The present invention maintains proper biasing of substrate/isolation-active region PN junctions. The method is applicable to bipolar, FET, and combinations of the two such as BiCMOS devices and integrated circuits and has distinct technical advantages over prior art methods of biasing junction isolated devices. For example, one such technical advantage is that the invention can be designed into the integrated circuit device without altering the fabrication process flow. Additionally the present substrate/isolating biasing means can be incorporated without altering the desired operational characteristics of the IC.

Another attendant technical advantage of the present invention is that the biasing means allows the device to withstand the application of inverse voltages to device pins. By clamping the parasitic mechanisms the reverse breakdown characteristics of the IC is substantially increased over prior art devices.

The present invention also provides a means for preventing parasitic forward biasing of a semiconductor PN junction of a junction isolated semiconductor device having a biasing element for reducing a voltage potential of said PN junction to a level below a forward biasing potential, said biasing element including means for diverting current away from said junction.

Additionally, the present invention allows for reverse supply blocking by the emitter-base breakdown characteristics of the substrate/isolation bias transistors.

Another attendant technical advantage of the invention is that the present device may be applied to multi-epitaxial device structures. In this embodiment the invention is especially well suited for the elimination of parasitic SCRs, as well as vertical and lateral parasitic mechanisms.

It should be noted that junction isolated devices are essential components of electronic devices, such as analog and digital integrated circuits. One particular circuit is a driver circuit. It is expected that the present invention will be incorporated into existing products to eliminate parasitic mechanisms.

FIG. 14 depicts in schematic form a device such as that shown in FIG. 4, with a single transistor Q4 as the biasing element. The transistor device has a first load terminal connected to the isolation, a second load terminal connected to an external connection, and a control terminal for turning on the transistor.

The specific embodiments and the corresponding values and ranges discussed herein are given for illustration of the preferred embodiments and not for the purpose of limitation. It is to be understood that the applications of the invention and the parameters relating to these changes may be changed as a matter of engineering design choices. Therefore such changes made without departing from the scope of the invention as disclosed and defined by the appended claims are deemed to be equivalents of the invention.

I claim:

1. A device for preventing parasitic mechanisms in junction isolated semiconductor devices, comprising:
    an isolating biasing element operatively connected to an isolation region between said semiconductor devices and operatively connected to a voltage potential available to said semiconductor device for biasing said junction isolation to the voltage potential available to said semiconductor device, said biasing element also having a control terminal for receiving a control signal.

2. The device of claim 1, wherein said semiconductor device is an integrated circuit chip.

3. The device of claim 1, wherein said semiconductor device is a discrete semiconductor device.

4. The device of claim 1, wherein said isolation biasing element comprises an active transistor device having:
    a first load terminal connected to said isolation;
    a second load terminal connected to an external connection; and
    a control terminal for receiving a control signal for turning on said active transistor device.

5. Means for preventing parasitic forward biasing of isolation junctions between isolation regions and active devices in a semiconductor device comprising:
    a first biasing means having a first load terminal connected to ground potential;
    a second load terminal connected to the isolation region of said isolation junction, and a control terminal; and
    a second biasing means having a first load terminal connected to an external connection of said semiconductor device, a second load terminal connected to said isolation region, a control terminal connected to said control terminal of said first biasing mans, said control terminals receiving a control signal,
    said first biasing means biasing said isolation region to said round potential when said ground potential is lower than a potential at said external connection, and said second biasing means biasing said isolation to the potential at said external connection when said potential is lower than said ground potential.

6. The means of claim 5, wherein said isolation junction comprises an epitaxial-tank/substrate-junction wherein said 10 substrate is the isolation region.

7. The means of claim 5, wherein said isolation junction comprises an epitaxial-tank/isolation-region junction wherein said isolation region provides the isolation.

8. The means of claim 6, wherein said epitaxial-tank is N-type semiconductor material and said substrate is P-type semiconductor material.

9. The means of claim 6, wherein said epitaxial-tank is P-type semiconductor material and said substrate is N-type semiconductor material.

10. The means of claim 7, wherein said epitaxial-tank is N-type semiconductor material and said isolation region is P-type semiconductor material.

11. The means of claim 7, wherein said epitaxial-tank is P-type semiconductor material and said isolation region is N-type semiconductor material.

12. Means for preventing parasitic forward biasing of a semiconductor PN junction of a junction isolated semiconductor device comprising:
a biasing element for reducing a voltage potential of said PN junction to a level below a forward biasing potential, said biasing element including means for diverting current away from said junction, said biasing element further having a control terminal for receiving a control signal for turning on said biasing element.

13. The means of claim 12 wherein said biasing element comprises:
an active transistor device having, an output terminal connected to one side of said PN junction, at least one low potential terminal connected to the opposite side of said PN junction, a control terminal for receiving bias input for turning on said biasing element to provide an output voltage at said output terminal.

14. The means of claim 13, wherein said biasing element is a field effect device, said output terminal is a source said low potential terminal is a drain, and said control terminal is a gate.

15. The means of claim 13, wherein said biasing element is a bipolar device, said output terminal is a collector, said low potential terminal is an emitter, and said control terminal is a base.

16. The means of claim 12, wherein said semiconductor device is an integrated circuit device including bipolar and field effect devices.

17. The device of claim 4 wherein said external connection is connected to a voltage potential.

18. The means of claim 4, wherein said active transistor device further includes a third load terminal connected to ground.

19. A device for preventing parasitic mechanisms, in semiconductor devices having multi-epitaxial layers and junction isolation at isolation regions comprising:
first and second biasing elements operatively connected to different ones of said isolation regions for simultaneously applying first and second isolation biasing voltages to said different isolation regions in response to different biasing voltage needs set at control terminals of said first and second biasing elements.

20. The device of claim 19, wherein said multi-epitaxial layer device includes a first epitaxial layer having a dopant type different from a second epitaxial layer dopant type, said first epitaxial layer including isolation regions of said second dopant type for separating said epitaxial layer into at least two biasing zones corresponding to said first and second biasing elements, said isolation regions being biased to a fixed potential.

21. A device for preventing parasitic mechanisms, comprising:
a biasing element operatively connected to a semiconductor device isolation region for removing current from said isolation region, said biasing element having a control terminal for receiving a signal turning the biasing element on and off.

22. The device of claim 1, wherein said semiconductor device includes circuitry for providing reverse supply protection for said semiconductor devices.

23. The device of claim 19, wherein said semiconductor device includes circuitry for providing reverse supply protection for said semiconductor devices.

24. The device of claim 1, wherein said junction isolated devices are formed including multi-epitaxial layers.

* * * * *